(12) United States Patent
Fitzgerald et al.

(10) Patent No.: US 7,160,758 B2
(45) Date of Patent: Jan. 9, 2007

(54) ELECTRONIC PACKAGING APPARATUS AND METHOD

(75) Inventors: Thomas J Fitzgerald, Phoenix, AZ (US); Carl L. Deppisch, Chandler, AZ (US); Manjit Dhindsa, Phoenix, AZ (US); Mark Norwil, Chandler, AZ (US); Matthew J. Schaenzer, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/815,185

(22) Filed: Mar. 31, 2004

(65) Prior Publication Data

US 2005/0218508 A1    Oct. 6, 2005

(51) Int. Cl.
  *H01L 21/44*    (2006.01)
  *H01L 21/50*    (2006.01)
(52) U.S. Cl. ............... 438/121; 438/122; 257/E21.499
(58) Field of Classification Search ............. 438/122, 438/108, 106, 117, 121; 257/712, 778, E21.499, 257/E21.502; 264/272.17
See application file for complete search history.

(56) References Cited

U.S. PATENT DOCUMENTS

| 5,276,289 | A | * | 1/1994 | Satoh et al. ............... 174/260 |
| 5,737,191 | A | * | 4/1998 | Horiuchi et al. ............ 361/764 |
| 5,773,362 | A | * | 6/1998 | Tonti et al. ................. 438/665 |
| 2002/0096508 | A1 | * | 7/2002 | Weaver et al. ........... 219/444.1 |
| 2002/0180035 | A1 | * | 12/2002 | Huang et al. ............... 257/706 |
| 2003/0129826 | A1 | * | 7/2003 | Werkhoven et al. ........ 438/627 |

OTHER PUBLICATIONS

IBM Technical Disclosure Bulletin, NN79034125, "Liquid-Filled Bellows Heat Sink," 1979.*
IBM Technical Disclosure Bulletin, NN79091553, "Semiconductor Chip with Liquid Metal Heat Transfer," 1979.*

* cited by examiner

*Primary Examiner*—Scott B. Geyer
(74) *Attorney, Agent, or Firm*—Schwegman, Lundberg, Woessner & Kluth, P.A.

(57) ABSTRACT

An electronic assembly includes a substrate, a device attached to the substrate, and a thermally conductive heat spreader covering the device and at least a portion of the substrate. A metal substantially fills the space between the device and the thermally conductive heat spreader. A method includes attaching at least one die to a substrate, placing a thermally conductive heat spreader over the die, and injecting a molten metal material into the space between the thermally conductive heat spreader and the die.

42 Claims, 9 Drawing Sheets

ELECTRONIC PACKAGING APPARATUS AND METHOD

FIELD OF THE INVENTION

The present invention relates generally to apparatus and methods for the dissipation of thermal energy from heat-producing components. More particularly, it relates to liquid metal infiltration of electronic packages with solder thermal interface materials.

BACKGROUND OF THE INVENTION

Today's semiconductor devices, whether discrete power or logic ICs, are smaller, run faster, do more and generate more heat. Some desktop microprocessors dissipate power levels in the range of 50 to 100 watts. These power levels require thermal management techniques involving large capacity heat sinks, good air flow and careful management of thermal interface resistances. A well designed thermal management program will keep operating temperatures within acceptable limits in order to optimize device performance and reliability.

Semiconductor devices are kept within their operating temperature limits by transferring junction-generated waste heat to the ambient environment, such as the surrounding room air. This is best accomplished by attaching a heat sink to the semiconductor package surface, thus increasing the heat transfer between the hot case and the cooling air. A heat sink is selected to provide optimum thermal performance. Once the correct heat sink has been selected, it must be carefully joined to the semiconductor package to ensure efficient heat transfer through this newly formed thermal interface.

Thermal materials have been used to join a semiconductor package and a heat sink, and to dissipate the heat from semiconductor devices, such as microprocessors. Thermal interface material (TIM) typically includes a polymer matrix and a thermally conductive filler. The TIM technologies used for electronic packages encompass several classes of materials such as epoxies, greases, gels and phase change materials.

Metal filled epoxies commonly are highly conductive materials that thermally cure into highly crosslinked materials. However, they have significant integration issues with other components of the package. For example, many times metal filled epoxies exhibit localized phase separation within the material that can result in high contact resistance. Furthermore, the metal filled epoxies can also delaminate at the interfaces.

Thermal greases are in a class of materials that offers several advantages compared to other classes of materials, including good wetting and ability to conform to the interfaces, no post-dispense processing, and high bulk thermal conductivity. Greases provide excellent performance in a variety of packages; however, greases cannot be used universally with all packages due to degradation of thermal performance during temperature cycling. It is observed that in some packages greases migrate out from between the interfaces under cyclical stresses encountered during temperature cycling. This phenomenon is known as "pump out."

In some applications an integral heat spreader is used to spread the heat and protect the semiconductor device beneath the integral heat spreader. In some applications, air is trapped within the integral heat spreader. Air is a poor thermal conductor.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

Figure 1:
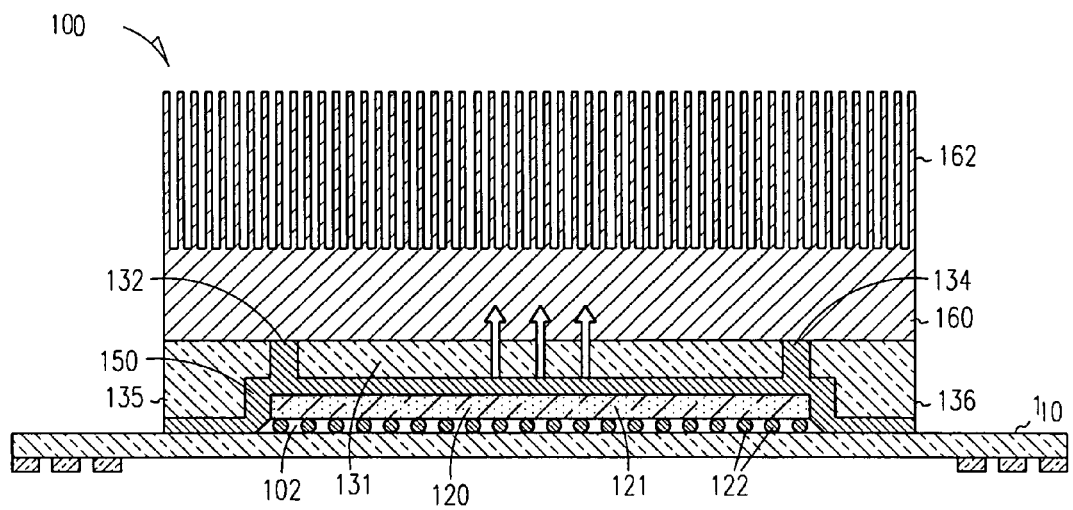
FIG. 1 is a cross-section view of an electronic assembly according to an embodiment of the invention.

The description set out herein illustrates the various embodiments of the invention, and such description is not intended to be construed as limiting in any manner.

DETAILED DESCRIPTION

In the following detailed description, reference is made to the accompanying drawings, which are not necessarily to scale, which form a part hereof, and in which is shown, by way of illustration, specific embodiments in which the apparatus and methods can be practiced. These embodiments are described in sufficient detail to enable those skilled in the art to practice them, and it is to be understood that the embodiments can be combined, or that other embodiments can be utilized and that procedural changes can be made without departing from the spirit and scope of the present invention. The following detailed description is, therefore, not to be taken in a limiting sense, and the scope is defined by the appended claims and their equivalents. In the drawings, like numerals describe substantially similar components throughout the several views.

FIG. 1 is a cross-sectional view of an electronic assembly 100, according to an embodiment of the invention. The electronic assembly 100 includes a substrate 110, a device 120 attached to the substrate 110, and a thermally conductive heat spreader 130 covering the device 120 and at least a portion of the substrate 110. A metal 150 is interposed between the device 120 and the thermally conductive heat spreader 130. In some embodiments, the metal 150 substantially fills the space between the device 120 and the thermally conductive heat spreader 130. The metal 150 has a lower melting point than the melting point of the thermally conductive heat spreader 130. The metal 150 is a thermal interface material between the device 120 and the thermally conductive heat spreader 130. The thermally conductive heat spreader 130 further includes a first column 132 and a second column 134. Both the first column 132 and the second column are also substantially filled with the lower melting point metal 150. The thermally conductive heat spreader 130 includes a plate 131, and four sidewalls attached to the plate 131. The four sidewalls substantially surround the device 120 attached to the substrate 110. Two of the sidewalls 135, 136 are shown in FIG. 1. In some embodiments, the thermally conductive heat spreader 130 is cup-shaped. The device 120 includes at least one semiconductor die 121.

The semiconductor die 121 includes an integrated circuit. The semiconductor die 121 further includes solder bumps 122 formed on a major surface of the semiconductor die 121. The solder bumps 122 are formed according to the controlled collapse chip connect (C 4) process. The solder bumps 122 are structurally secured to the substrate 110 using a solder bump reflow process. The solder bumps 122 are also electrically connected to the integrated circuit of the semiconductor die 121, so that signals can be provided through the solder bumps 122 to and from the integrated circuit of the semiconductor die 121.

The electronic assembly 100 further includes an underfill material 102 located between the substrate 110 and the device 120. The underfill material 102 prevents metal 150 from entering the volume between the device 120 and the substrate 110. In some embodiments, the metal 150 substantially filling the space between the device and the thermally conductive heat spreader 130 is a solder material. In further embodiments, the metal substantially filling the space between the device 120 and the thermally conductive heat spreader 130 includes indium.

Figure 2:
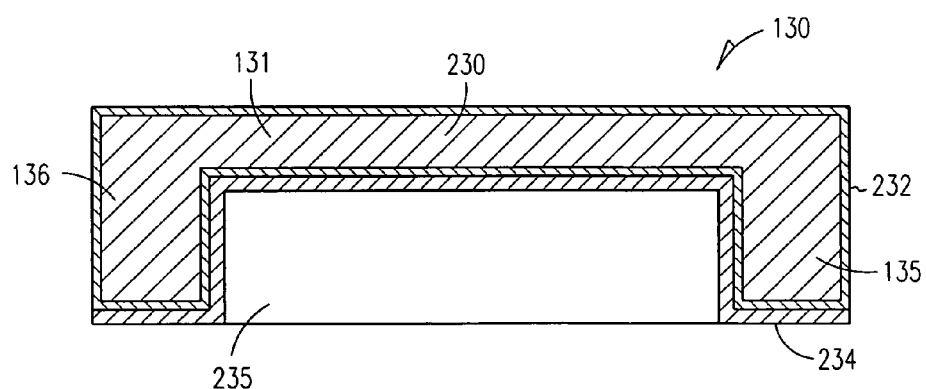
FIG. 2 is a cross-section view of a thermally conductive heat spreader according to an embodiment of the invention.

FIG. 2 is a cross-section view of a thermally conductive heat spreader 130 according to an embodiment of the invention. The thermally conductive heat spreader 130 includes a thin nickel layer 232 plated on a primary heat spreading structure 230. A layer of gold 234 is plated on a portion of the nickel layer 232. The layer of gold 234 provides enhanced adhesion of the metal 150 to the surfaces including the layer of gold 234. If the metal 150 used is a solder, the gold layer 234 provides enhanced solderability to the surfaces of the thermally conductive heat spreader 130 that have the layer of gold 234. The heat spreader includes a plate 131 and four side walls. Three sidewalls 135, 136 and 235 are shown in FIG. 2.

Figure 3:
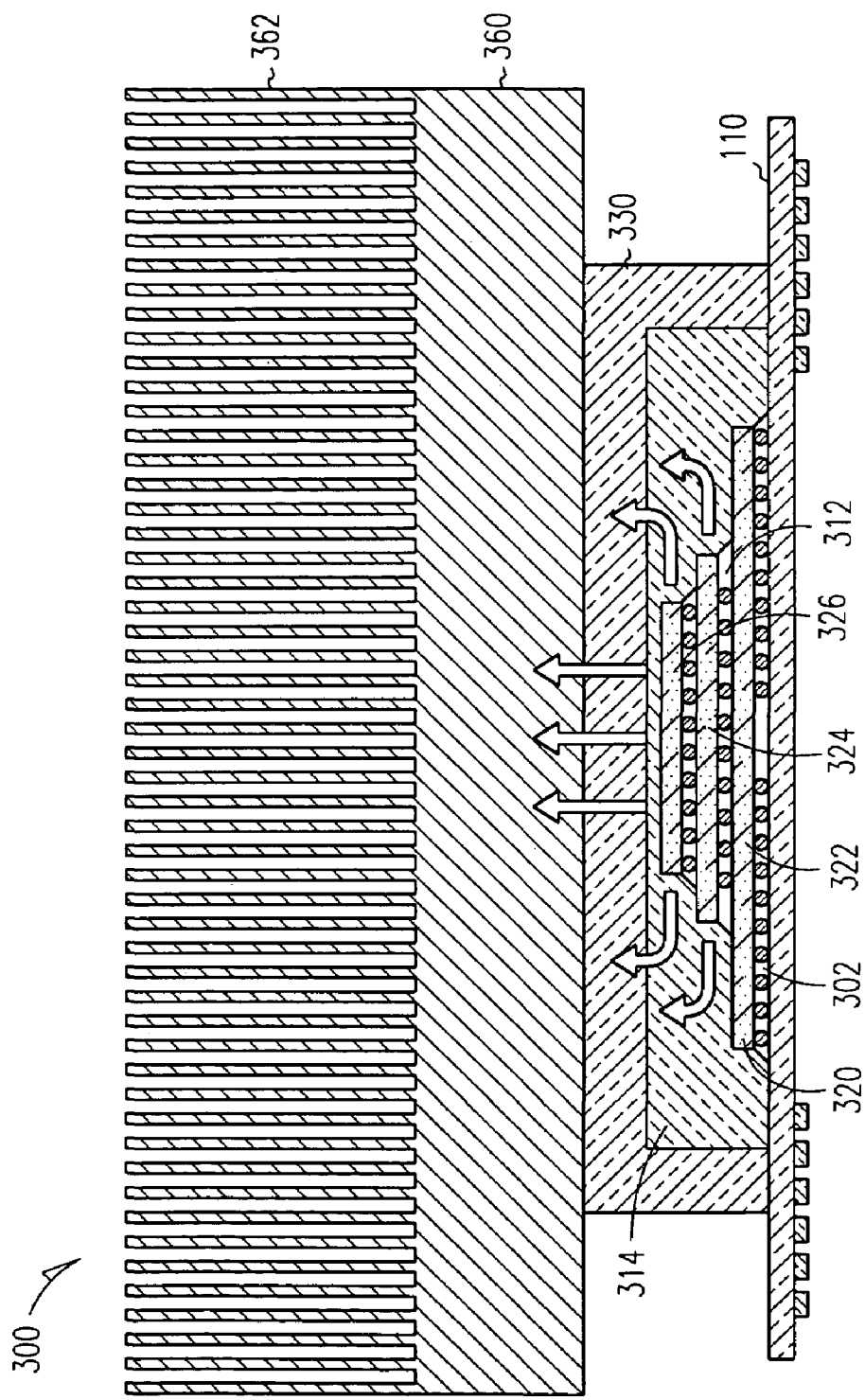
FIG. 3 is a cross-section view of an electronic assembly according to another embodiment of the invention.

FIG. 3 is a cross-section view of an electronic assembly 300 according to another embodiment of the invention. The electronic assembly 300 is similar to the electronic assembly 100 (shown in FIG. 1). Therefore, for the sake of brevity, the discussion of FIG. 3 will discuss the differences between the electronic assembly 300 and the electronic assembly 100. The electronic assembly 300 includes a substrate 110, a device 320 attached to the substrate 110, and a thermally conductive heat spreader 330 covering the device 320 and at least a portion of the substrate 330. A metal 350 is interposed between the device 320 and the thermally conductive heat spreader 330. In the embodiment shown, the metal 350 substantially fills the space between the device 320 and the thermally conductive heat spreader 330. The metal 350 is a thermal interface material between the device 320 and the thermally conductive heat spreader 130. The device 320 includes a first semiconductor die 322, a second semiconductor die 324, and a third semiconductor die 326. The first semiconductor die 322 is attached to the substrate 110. An underfill material 302 is placed between the first semiconductor die 322 and the substrate 110. The second semiconductor die 324 is attached to the first semiconductor die 322. An underfill material 312 is placed between the first semiconductor die 322 and the second semiconductor die 324. The third semiconductor die 326 is attached to the second semiconductor die 324. An underfill material 314 is placed between the second semiconductor die 324 and the third semiconductor die 326. A thermally conductive heat spreader 330 is placed over the device 320. A heat sink 360 is attached to the thermally conductive heat spreader 330. The heat sink 360 is attached to the thermally conductive heat spreader 330 so as to provide a thermally conductive pathway between the heat sink 360 and the thermally conductive heat spreader 330. The heat sink 360 includes a plurality of fins 362 for dissipating heat to the atmosphere near the assembly. The arrows in FIG. 3 represent heat flow or thermal conductivity from the semiconductor dies 322, 324, 326, through the metal thermal interface material 350, to the thermally conductive heat spreader 330 and to the heat sink 360.

Figure 4:
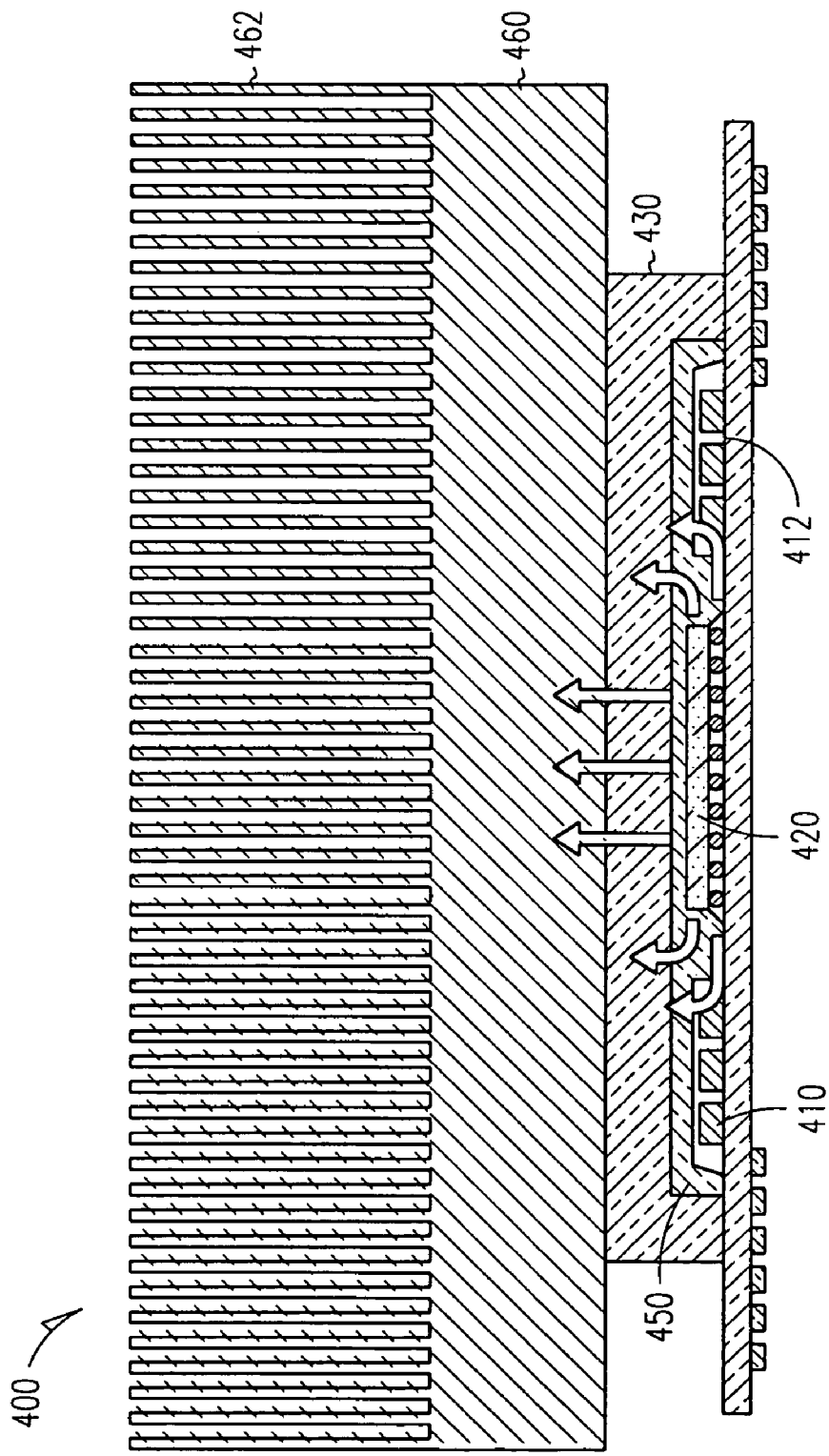
FIG. 4 is a cross-section view of an electronic assembly according to yet another embodiment of the invention.

FIG. 4 is a cross-section view of an electronic assembly 400 according to another embodiment of the invention. The electronic assembly 400 is similar to the electronic assembly 100 (shown in FIG. 1). Therefore, for the sake of brevity, the discussion of FIG. 4 will discuss the differences between the electronic assembly 400 and the electronic assembly 100. The electronic assembly 400 includes a semiconductor die 420 as well as a first component 410 and a second component 412 that are attached to the substrate 110. The first component 410 and the second component 412 are placed under a thermally conductive heat spreader 430. A low melting point metal 450 is interposed between the thermally conductive heat spreader 430 and the semiconductor die 420. In the embodiment shown, the metal 450 substantially fills the space between the thermally conductive heat spreader 430 and the semiconductor die 420 and the components 410, 412. The metal 450 is a thermal interface material between the semiconductor die 420 and the thermally conductive heat spreader 430. The metal 450 is a thermal interface material between the components 410, 412 and the thermally conductive heat spreader 430. The first component 410 and the second component 412 are sealed. This prevents the metal 450 from contacting the contacts on the components 410, 412 and causing a short in the components. A heat sink 460 is attached to the thermally conductive heat spreader 430. The heat sink 460 is attached to the thermally conductive heat spreader 430 so as to provide a thermally conductive pathway between the heat sink 460 and the thermally conductive heat spreader 430. The heat sink 460 includes a plurality of fins 462 for dissipating heat to the atmosphere near the assembly. The arrows in FIG. 4 represent heat flow or thermal conductivity from the semiconductor die 420, through the metal thermal interface material 450, to the thermally conductive heat spreader 430 and to the heat sink 460.

FIGS. 5–9 show various stages of manufacturing an electronic assembly, according to an embodiment of the invention. It should noted that once one or more semiconductor dies have been attached to the substrate 110, the manufacturing process is substantially the same. As shown in FIGS. 5–9, the electronic assembly includes only one semiconductor die attached to the substrate 110. An electronic assembly having a plurality of semiconductor dies could also be used as an example and the manufacturing process after attaching the semiconductor dies is substantially the same. Additional components, such as capacitors, resistors, and other passive devices, may also be attached to the substrate 110 and placed under the thermally conductive heat spreader 430. For all components that will be positioned beneath the thermally conductive heat spreader 430 are electrically isolated from molten material, an underfill fill material 102 is placed between the component and the substrate 110 to prevent molten metal from entering the space between the substrate and the component. In addition, each die and each component is also further electrically isolated. Encapsulation with a polymer or other similar electrically insulative material is provided for the components that will be exposed to molten metal in the process discussed below. In a stacked configuration such as shown in FIG. 3, the die or component adjacent the substrate 110 is underfilled. The remaining stacked dies or components are encapsulated using a polymer. The dies or components may be partially or fully encapsulated. Stacked die packages often contain wirebonds from the substrate 110 to the stacked dies. Encapsulation of the stack prevents the liquid, molten, metal from shorting these wires. In addition, any bonding sites for attaching the wirebonds to the substrate 110 or another component are also encapsulated.

In addition, a wetting layer to enhance solderability can also be provided on the surfaces of the components, the substrate 130 and the thermally conductive heat spreader 430 that will contact molten metal during infiltration or flowing of the metal as discussed below. Such a wetting layer aids liquid metal infiltration and bonding on the surfaces on the inside of the package and more specifically within the space between the components and the thermally conductive heat spreader. The wetting layer can include a gold, silver, or tin coating applied to the substrate, encapsulation, and other surfaces within the space via plating, sputtering, or similar method.

Figure 5:
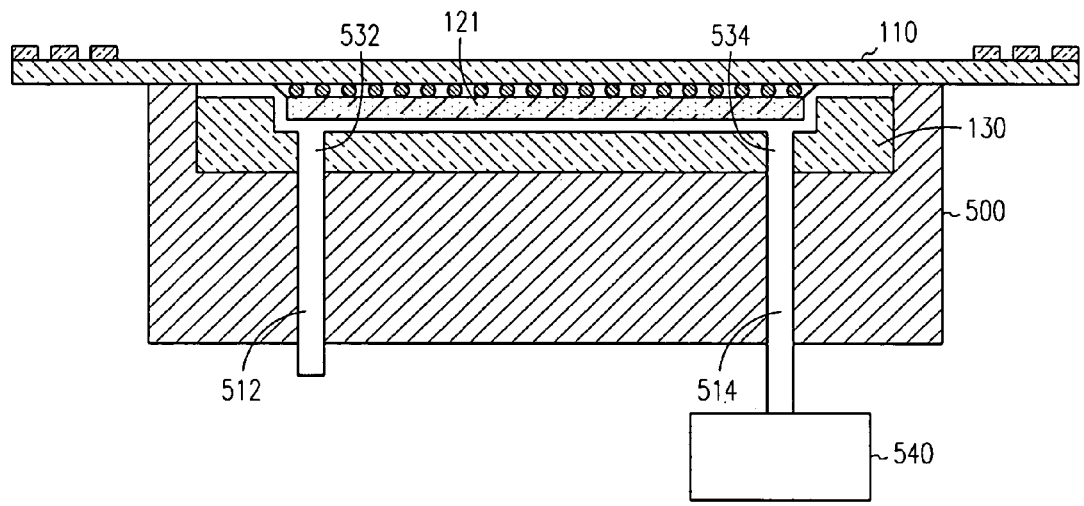
FIG. 5 is a cross-section view of an electronic assembly during manufacture, according to an embodiment of the invention.

FIG. 5 is a cross-section view of an electronic assembly during manufacture, according to an embodiment of the invention. A mold 500 is placed over a thermally conductive heat spreader 130. The thermally conductive heat spreader 130 covers the die 121 that is attached to the substrate 110. The thermally conductive heat spreader 130 includes a first gate or channel for fluid communication 532 and a second gate or channel for fluid communication 534. The mold 500 also includes a first gate or channel for fluid communication 512 and a second gate or channel for fluid communication 514. When positioned properly, the gate 532 substantially aligns with gate 512, and the gate 534 substantially aligns with gate 514. The mold 500 is preheated. The mold 500 is held in place until the thermally conductive heat spreader 130 is heated to a selected point. Other portions of electronic assembly may also be heated to a selected point. A source of vacuum 540 is connected to the gate 514 to remove gases from the space formed between the thermally conductive heat spreader 130 and the device 120. A vacuum is pulled prior to flowing, forcing or injecting metal into the space between the component or components and the thermally conductive heat spreader 130. In an alternative embodiment of the invention, a source of gas is connected to the gate 514. The gas is less reactive than the atmosphere. In some instances the gas is an inert gas. The less reactive gas is placed into the space between the die 121, the substrate 110 and the thermally conductive heat spreader 130 after initially pulling the vacuum. In other words, the atmospheric gas is replaced with a less reactive gas, such as an inert gas, in this alternative embodiment, after a vacuum is pulled. Since a perfect vacuum is rarely achievable, purging the space with an inert gas reduces the possibility of forming oxides or other contaminating substances in the space between the die 121, the substrate 110 and the thermally conductive heat spreader 130. For example, an initial vacuum is pulled on the cavity or space between the die 121, the substrate 110 and the thermally conductive heat spreader 130 many reaches elements and removed. Subsequent flushing of the space or cavity with an inert gas fills the cavity with non reactive element. A second vacuum is then applied to the space or cavity. This further lessens any amount of remaining reactive gas in the cavity. Any remaining amounts should not be harmful. For example, the remaining gas will not cause a liquid metal to form an oxide skin during infiltration.

Figure 6:
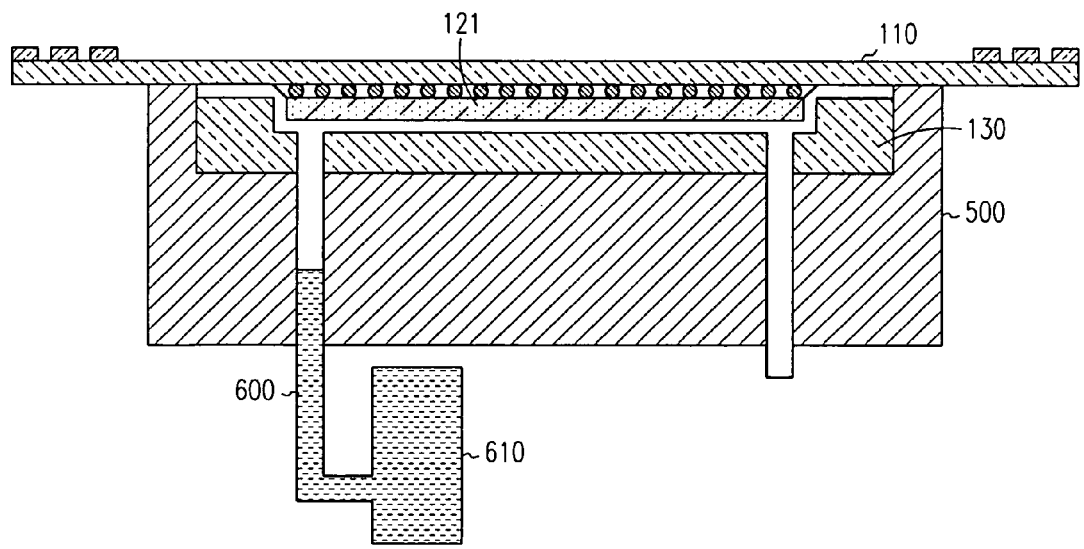
FIG. 6 is a cross-section view of an electronic assembly as molten metal is within a gate in a mold during manufacture, according to an embodiment of the invention.

FIG. 6 is a cross-section view of an electronic assembly while molten metal 600 is within a gate 512 in a mold 500 during manufacture, according to an embodiment of the invention. It should be noted that the term molten metal includes metal is in a liquid state as well as metal that is in a partially solidified state. Metal in a partially solidified state includes a portion that is in a solidified state. Metal in a partially solidified state tends not to shrink as much during cooling. In addition, metal in a partially solidified state has less latent heat release. In some embodiments, there may be applications for use of molten metal that is in a partially solidified state. Therefore, in the following discussion, molten metal will refer both to metal in a liquid state as well as to a metal that includes at least a portion in a solidified state.

As mentioned above, the mold 500 and other portions of the electronic assembly are heated to a selected temperature where a low melting point molten metal 600 will not solidify on contact with the mold or one of the portions of the electronic assembly. Once the selected temperature is reached, molten metal 600 from a source of molten metal 610 is placed into the gate 512 of the mold 500. The molten metal 600 can be any low melting point metal such as a solder compound. In some embodiments, the molten metal 600 includes indium. In some embodiments, the molten metal is a formulation of a solder including indium. The source of the molten metal 600 comes from the bottom of the source of molten metal 610 so as to reduce the number of oxides of the metal 600. The metal at the top of the source 610 is more likely to contain oxides of the molten metal 600. By removing molten metal from the bottom of the source of molten metal, the possibility of entrapping oxides or oxide films in the molten metal flowed into the space between the devices and the thermally conductive heat spreader is lessened.

Figure 7:
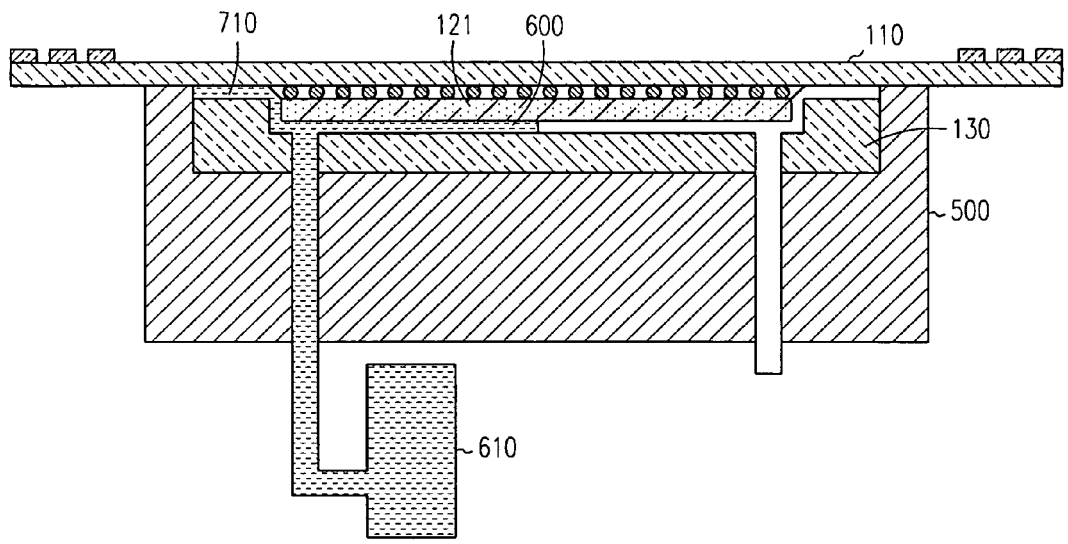
FIG. 7 is a cross-section view of an electronic assembly after molten metal has partially filled the space between the die and the thermally conductive heat spreader, according to an embodiment of the invention.

FIG. 7 is a cross-section view of an electronic assembly during manufacture after molten metal has partially filled the space between the die and the thermally conductive heat spreader, according to an embodiment of the invention. In FIG. 7 the molten metal is interposed between the device and the thermally conductive heat spreader. The molten metal 600 continues through gate 512 and gate 532 and enters the space between the die 121 and the thermally conductive heat spreader 130. The molten metal 600 is pressurized or pumped into the space between the die 121 and the thermally conductive heat spreader 130. The molten metal is flowed, injected, forced or similarly placed into the space between the device and the thermally conductive heat spreader. The objective is to interpose molten metal between the device and the thermally conductive heat spreader. In some embodiments, the space between the die 121 and the thermally conductive heat spreader 130. As shown in FIGS. 5, 6 and 7, the molten metal also fills the gap or any gap 710 which is between the substrate 110 and the thermally conductive heat spreader 130 is substantially filled. It should be noted that the thermally conductive heat spreader 130 may include a layer of gold 234 (as shown in FIG. 2). The layer of gold improves the wettability of the molten metal to the thermally conductive heat spreader 130. The layer of gold 234 is present where the molten metal 600 is present during manufacture. It should also be noted that the device 120, and specifically the die 121, may also be treated with a metallization layer in order to facilitate wettability or bonding to the semiconductor die 121. Gold plating or a similar wetting layer, can be placed on some or all of the surfaces that make contact with the molten metal in the cavity or space. Plating or a wetting layer can be placed on the substrate. A wetting layer, such as gold, in some embodiments, is placed one on top of a polymer for encapsulating package components within the cavity or space. In some embodiments, a wetting layer is placed on internal package surfaces. A wetting layer could be put down by a variety of methods including plating, spluttering or similar method.

In addition, it should be noted that at the junction between the substrate 110 and the die 121, an underfilling 102 is preventing the molten metal from contacting individual electrical contacts associated with the die 121. The supply of molten metal 610 is pressurized or pumped until the entire space between the die 121 and the thermally conductive heat spreader 130 is filled. In some instances, the gap 710 between the thermally conductive heat spreader 130 and the substrate 110 is also filled.

Figure 8:
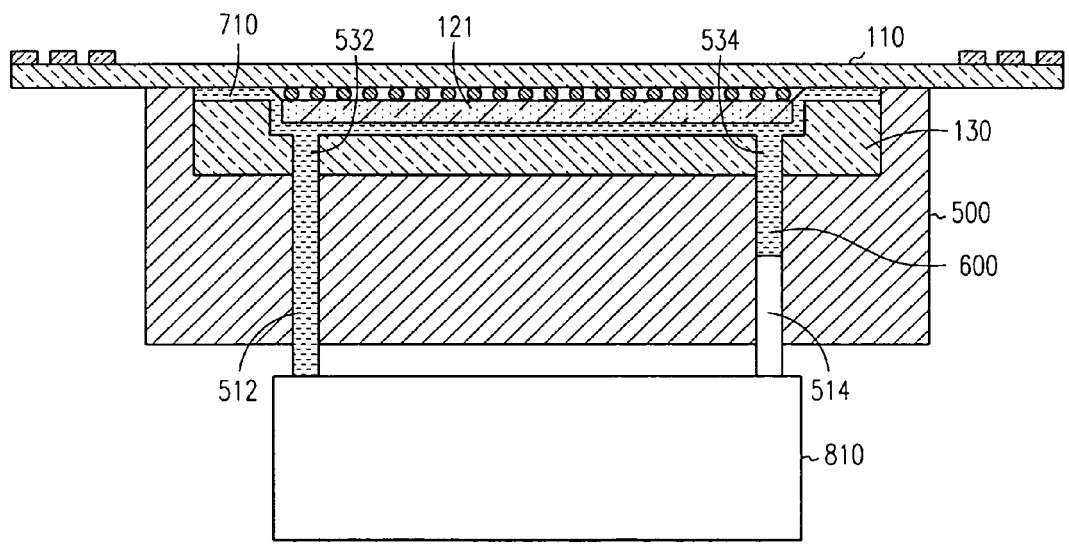
FIG. 8 is a cross-section view of an electronic assembly after molten metal has substantially filled the space between the die and the thermally conductive heat spreader, according to an embodiment of the invention.

FIG. 8 is a cross sectional view of an electronic assembly during manufacture after molten metal 600 has been placed between the die 121 and the thermally conductive heat spreader. As shown, the molten metal 600 has substantially filled the space between the die 121 and the thermally conductive heat spreader, according to an embodiment of this invention. The molten metal 600 also enters the gap 710 and a similar gap on the opposite side of the thermally conductive heat spreader 130. Once all the spaces are substantially filled with molten metal 600, the molten metal 600 enters the gate 534 in the thermally conductive heat spreader 130 and enters the gate 514 in the mold 500. A source of pressure 810 is attached to the gate 512 and to the gate 514 of the mold 500. A pressure is then applied to the molten metal 600 which is in the spaces described above. By applying a pressure, shrinkage due to cooling of the molten metal 600 is reduced and controlled. In addition, applying a pressure from the source of pressure 810 also controls porosity in the metal 600 as it solidifies. Shrinkage and excessive porosity result in less thermal conductivity in the solidified metal. In other words, excessive porosity and shrinkage during cooling can compromise the thermal conductivity of the molten metal upon solidification. The pressure is continuously applied to the gates 512 and 514 of the mold 500 until the molten metal 600 is solidified. Then the mold 500 and the source of pressure 810 are removed.

In an alternative embodiment, a source of pressure is applied to the molten metal 600 from the initial stage of flowing, forcing, injecting or interposing the molten metal into the space between the die 121 and the thermally conductive heat spreader 130. Pressure is applied continuously as the molten metal is flowed into the space between the die 121 and the thermally conductive heat spreader 130 and maintained after the space is filled and the molten metal cools to a solid state. This alternative embodiment, further controls shrinkage and excessive porosity. The source of pressure 810 can be any source of pressure, such as a pressurized gas or a piston. In addition, the molten metal can be moved in a number of different ways, including the use of electromagnetic forces to pump the molten metal or Lorenz forces. The pressure may be modified at different times. For example, after the cavity or space is filled, the pressure may be increased or decreased or otherwise changed as the molten metal solidifies.

Figure 9:
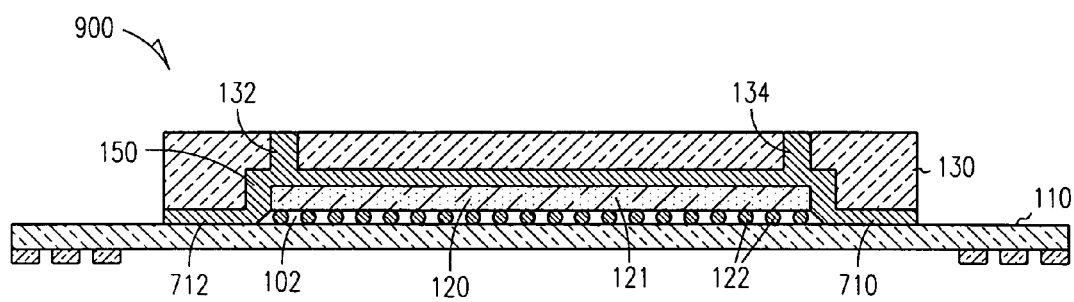
FIG. 9 is a cross-section view of an electronic assembly after a mold has been removed from the electronic assembly, according to an embodiment of the invention.

FIG. 9 is a cross sectional view of an electronic assembly 900 after the mold 500 (shown in FIGS. 5–8) has been removed, according to an embodiment of the invention. FIG. 9 corresponds to FIG. 1, with the heat sink 160 removed from the thermally conductive heat spreader 130. In some embodiments, a heat spreader may be used and in other embodiments a heat spreader may not be attached to the assembly shown in FIG. 9. The electronic device 900 shown in FIG. 9 includes a substrate 110 with a device 120 attached to the substrate 110. Specifically, the device is a semiconductor die 121 having solder balls 122 which are connected to corresponding pads on the substrate 110. The electrical connections between the die 121 and the substrate 110 are enclosed or covered with an underfill material 102. After dies attach and before flowing the molten metal, the components under the thermally conductive heat spreader can also encapsulated before flowing molten metal. The encapsulation may be full or partial. Pads for bonding wires can also be encapsulated. The die 121 and a portion of the substrate 110 are covered with a thermally conductive heat spreader 130. The gaps between the die 121 and the thermally conductive heat spreader 130 are filled with a metal 150. The thermally conductive heat spreader also includes a column 132 and a column 134 of the metal. As shown in FIG. 9, metal 150 also fills a gap 710 and a gap 712. It should be noted that the electronic assembly 900 shown in FIG. 9 has been flipped after the electronic assembly 900 has been removed from the mold in FIG. 8.

Figure 10:
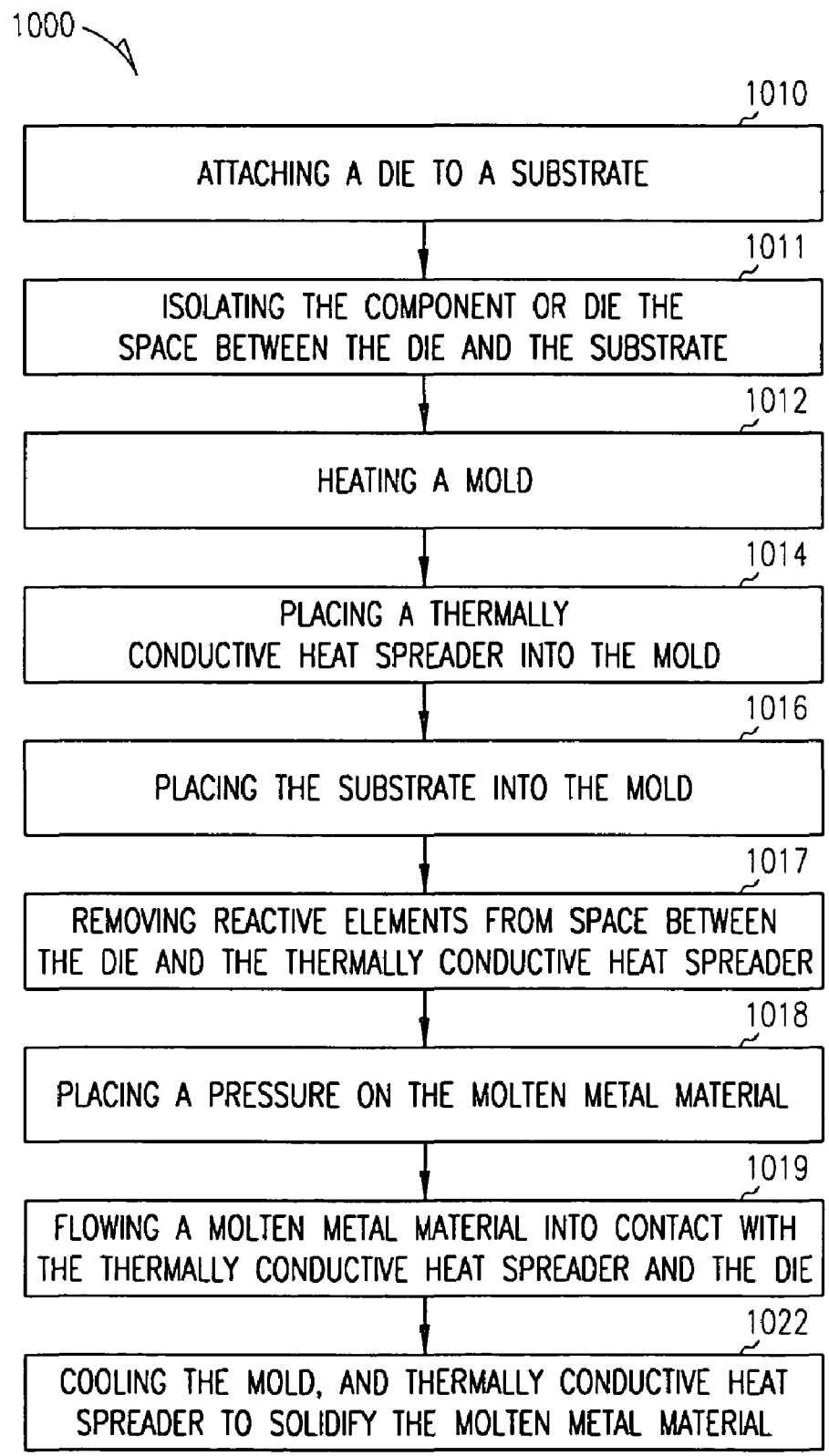
FIG. 10 is a flow diagram of a method of making the electronic assembly, according to an embodiment of the invention.

FIG. 10 is a flow diagram of a method 1000 of making the electronic assembly, according to an embodiment of the invention. The method 1000 includes attaching a die to a substrate 1010, and isolating the die and other components 1011. Isolating includes underfilling the space between the die or component and the substrate. Isolating can also include encapsulating components, using a polymer or other electrically isolating material. Stacked die packages often contain wirebonds from the substrate 110 to the stacked dies. Encapsulation of the stack prevents the liquid, molten, metal from shorting these wires. The method 1000 also includes heating a mold 1012, placing a thermally conductive heat spreader into the mold 1014, and placing the substrate into the mold 1016. In some embodiments, the method also includes removing reactive elements from the space between the die and the thermally conductive heat spreader 1017. In one embodiment, removing reactive elements from the space between the die and the thermally conductive heat spreader includes initially placing a vacuum on the space between the die and the thermally conductive heat spreader, flushing the space with an inert gas and placing a second vacuum on the space. The method further includes placing a pressure on the molten metal material 1018. Pressure may be placed on the molten metal during substantially the entire process of flowing the metal. Pressurization may be constant or it can be changed at certain times, such as when the metal is cooling. The method 1000 also includes flowing a molten metal material into the space between the thermally conductive heat spreader and the die 1019. Flowing the molten metal material into the space between the thermally conductive heat spreader and the die includes flowing a molten metal material through a gate in the mold and a gate in the thermally conductive heat spreader. The method 1000 further includes cooling the mold, and thermally conductive heat spreader to solidify the molten metal material 1022. In some embodiments, cooling includes directional cooling.

Figure 11:
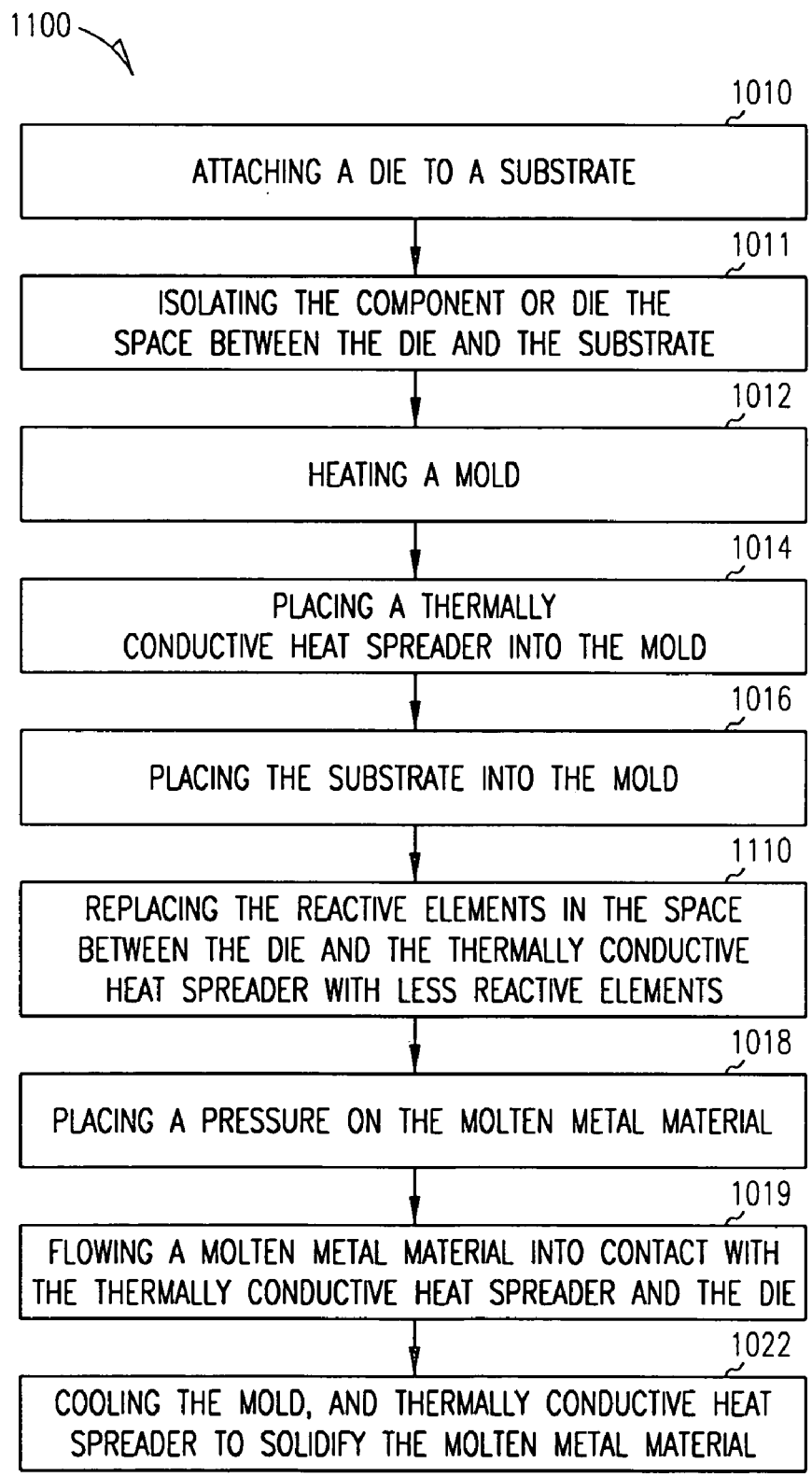
FIG. 11 is a flow diagram of another method of making the electronic assembly, according to an embodiment of the invention.

FIG. 11 is a flow diagram of another method 1100 of making the electronic assembly, according to an embodiment of the invention. The method 1100 is very similar to the method 1000. One element is replaced. The method 1100 includes replacing a first gas and the reactive elements therein in the space between the die and the thermally conductive heat spreader with a second inert or less reactive gas 1110. The second gas is less reactive than the first gas or the second gas is an inert gas. In some embodiments, the method includes stacking a second die onto the first die.

Figure 12:
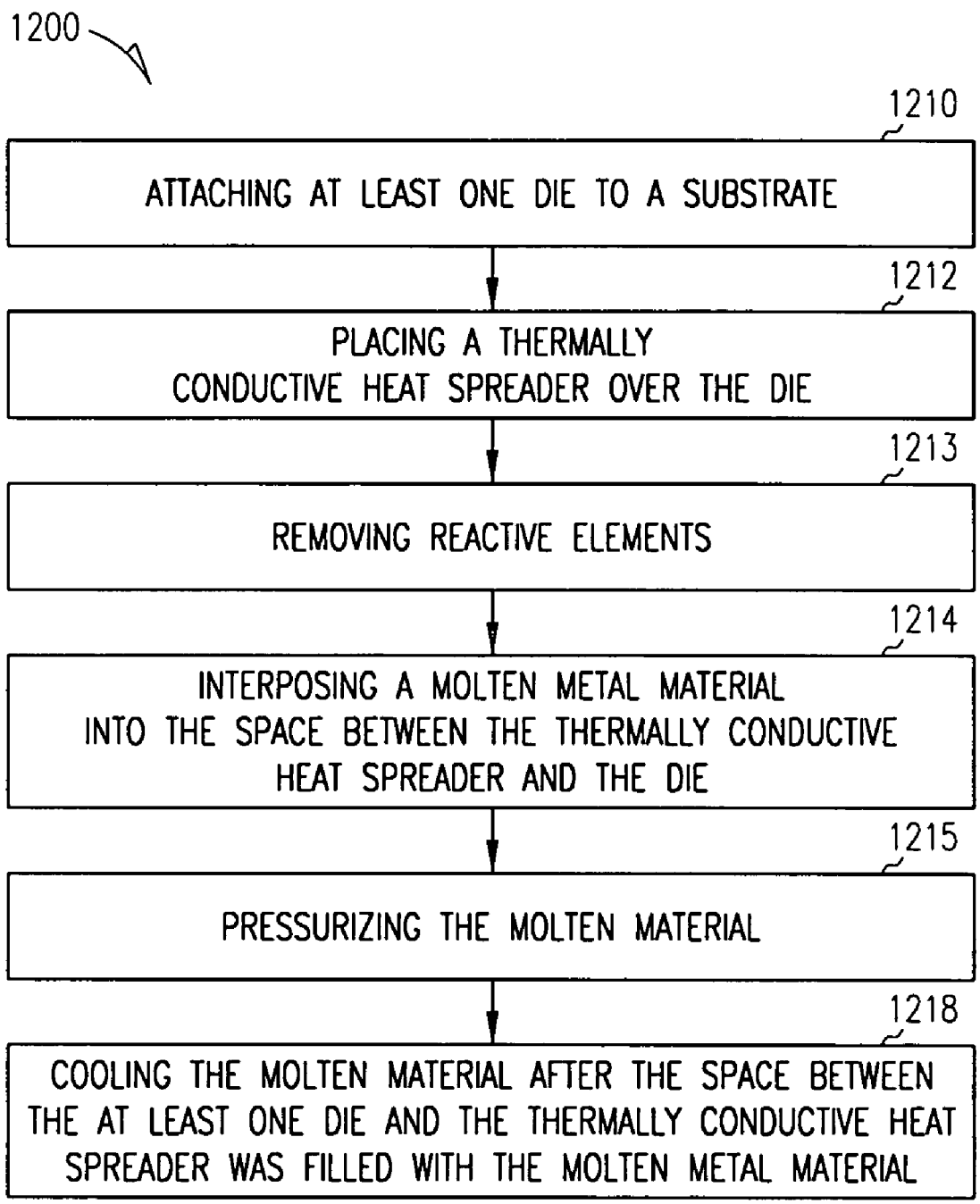
FIG. 12 is a flow diagram of another method of making the electronic assembly, according to an embodiment of the invention.

FIG. 12 is a flow diagram of another method 1200 of making the electronic assembly, according to an embodiment of the invention. The method 1200 includes attaching at least one die to a substrate 1210. In some embodiments, the method also includes underfilling the space between the die and the substrate and encapsulation of all components that will contact the molten metal. The method 1200 also includes placing a thermally conductive heat spreader over the die 1212. In some embodiments, the method includes removing reactive elements from the space between the die and the thermally conductive heat spreader 1213. Removing gas from the space between the die and the thermally conductive heat spreader 1213 can include placing a vacuum on the space between the die and the thermally conductive heat spreader. In some other embodiments, a first gas in the space between the die and the thermally conductive heat spreader is replaced with a second gas. The second gas is less reactive than the first gas or is an inert gas. The method 1200 may also include placing a second vacuum or partial vacuum on the space. The method 1200 also includes interposing a molten metal between the heat spreader and die by injecting a molten metal material into the space between the thermally conductive heat spreader and the die 1214. In some embodiments, the method includes pressurizing the molten metal material 1215. In other embodiments, the pressure is maintained during substantially the entire time the molten metal is injected or flowed through solidification of the molten metal. In some embodiments, the method 1200 also includes attaching a second die onto the substrate. In some embodiments, the method 1200 includes stacking a second die onto the at least one die attached to the substrate. The method 1200 also includes cooling the molten metal material after the space between the at least one die and the thermally conductive heat spreader was filled with the molten metal material 1216. The method 1200 can also include thermally attaching a heat sink to the thermally conductive heat spreader 1220.

It is to be understood that the above description is intended to be illustrative and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method comprising:
    attaching a die to a substrate;
    heating a mold;
    placing a thermally conductive heat spreader into the mold;
    placing the substrate into the mold; and
    flowing a molten metal material into contact with the thermally conductive heat spreader and the die to substantially fill a space between the thermally conductive heat spreader and the die with the metal material.

2. The method of claim 1 further comprising underfilling the space between the die and the substrate.

3. The method of claim 1 further comprising encapsulating the die.

4. The method of claim 1 wherein flowing a molten metal material into contact with the thermally conductive heat spreader and the die includes flowing a molten metal material through a gate in the mold and a gate in the thermally conductive heat spreader.

5. The method of claim 1 further comprising cooling the mold and the thermally conductive heat spreader to solidify the molten metal material.

6. The method of claim 1 further comprising placing a pressure on the molten metal material.

7. The method of claim 6 wherein placing a pressure on the molten metal includes maintaining a pressure substantially during flowing a molten material.

8. The method of claim 1 further comprising removing reactive components from the space between the die and the thermally conductive heat spreader.

9. The method of claim 8 wherein removing reactive components from the space between the die and the thermally conductive heat spreader further includes:
    initially drawing a vacuum on the space between the die and the thermally conductive heat spreader to substantially remove a first gas; and
    purging the space between the die and the thermally conductive heat spreader with a second gas.

10. The method of claim 9 wherein the second gas is less reactive than the first gas.

11. The method of claim 9 further comprising drawing a second vacuum on the space between the die and the thermally conductive heat spreader.

12. The method of claim 9 wherein the second gas is an inert gas.

13. The method of claim 1 further comprising adding a wetting layer to at least one of the surfaces associated with the space between the substrate and the thermally conductive heat spreader.

14. The method of claim 1 further comprising stacking a second die onto the first die.

15. The method of claim 14 further comprising encapsulating the first die and second die.

16. The method of claim 1 further comprising:
    adding at least one other component to the substrate;
    underfilling the at least one other component; and
    encapsulating the at least one other component.

17. A method comprising:
    attaching at least one die to a substrate;
    placing a thermally conductive heat spreader over the die, the thermally conductive heat spreader surrounding the die; and
    interposing a molten metal material between the thermally conductive heat spreader and the die, the molten metal material substantially filling a gap between the die and the thermally conductive heat spreader.

18. The method of claim 17 further comprising attaching a second die onto the substrate.

19. The method of claim 17 further comprising stacking a second die onto the at least one die attached to the substrate.

20. The method of claim 17 further comprising underfilling the space between the die and the substrate.

21. The method of claim 17 wherein interposing a molten metal material further comprises removing the molten metal material from a portion of a vessel that is not exposed to the atmosphere.

22. The method of claim 17 further comprising adding a wetting layer to at least one surface in the space between the die and the substrate.

23. A method comprising:
attaching at least one die to a substrate;
placing a thermally conductive heat spreader over the die;
interposing a molten metal material between the thermally conductive heat spreader and the die, the molten metal material substantially filling a gap between the die and the thermally conductive heat spreader; and
cooling the molten metal material after the space between the at least one die and the thermally conductive heat spreader was filled with the molten metal material.

24. The method of claim 23 further comprising pressurizing the molten metal material.

25. A method comprising:
attaching a die to a substrate;
placing a heat spreader into a mold;
placing the substrate and die into the mold; and
flowing a molten metal material into contact with the heat spreader and the die to substantially fill a gap between the heat spreader and the die.

26. The 1method of claim 25 further comprising underfilling the space between the die and the substrate.

27. The method of claim 25 further comprising encapsulating the die.

28. The method of claim 25 wherein flowing a molten metal material into contact with the heat spreader and the die includes flowing a molten metal material through a gate in the mold and a gate in the heat spreader.

29. The method of claim 25 further comprising cooling the mold and the thermally conductive heat spreader to solidify the molten metal material.

30. The method of claim 25 wherein flowing a molten metal material into contact with the heat spreader and the die includes filling the space between the heat spreader and the die.

31. The method of claim 25 further comprising covering an electrical contact between the die and the substrate.

32. The method of claim 25 further comprising covering a plurality of electrical contacts between the die and the substrate with a material that is stable in the presence of the molten metal.

33. The method of claim 25 further comprising placing a pressure on the molten metal material.

34. The method of claim 25 further comprising encapsulating the die with a material that is stable in the presence of the molten metal.

35. The method of claim 25 further comprising adding an other component.

36. The method of claim 35 further comprising providing an underfiller between the other component and a surface to which the another component is attached.

37. The method of claim 35 further comprising encapsulating the die and the other component.

38. The method of claim 35 further comprising:
isolating a plurality of electrical contacts between the die and the substrate to which the die is attached from the molten metal; and
isolating a plurality of electrical contacts between the other component and a surface to which the other component is attached from the molten metal.

39. The method of claim 35 wherein adding an other component includes attaching the other component to the die.

40. The method of claim 35 wherein adding an other component includes attaching the other component to the substrate.

41. A method comprising:
attaching a die to a substrate;
heating a mold;
placing a thermally conductive heat spreader into the mold;
placing the substrate into the mold; and
flowing a molten metal material into contact with the thermally conductive heat spreader and the die, wherein flowing a molten metal material into contact with the thermally conductive heat spreader and the die includes flowing a molten metal material through a gate in the mold and a gate in the thermally conductive heat spreader.

42. A method comprising:
attaching a die to a substrate;
placing a heat spreader into a mold;
placing the substrate and die into the mold; and
flowing a molten metal material into contact with the heat spreader and the die, wherein flowing a molten metal material into contact with the heat spreader and the die includes flowing a molten metal material through a gate in the mold and a gate in the heat spreader.

* * * * *

UNITED STATES PATENT AND TRADEMARK OFFICE
CERTIFICATE OF CORRECTION

| | | |
|---|---|---|
| PATENT NO. | : 7,160,758 B2 | Page 1 of 1 |
| APPLICATION NO. | : 10/815185 | |
| DATED | : January 9, 2007 | |
| INVENTOR(S) | : Fitzgerald et al. | |

It is certified that error appears in the above-identified patent and that said Letters Patent is hereby corrected as shown below:

In column 11, line 29, in Claim 26, delete "1method" and insert -- method --, therefor.

Signed and Sealed this

Twenty-second Day of May, 2007

JON W. DUDAS
*Director of the United States Patent and Trademark Office*